United States Patent [19]

Baker

[11] Patent Number: 5,229,305
[45] Date of Patent: Jul. 20, 1993

[54] METHOD FOR MAKING INTRINSIC GETTERING SITES IN BONDED SUBSTRATES

[75] Inventor: James W. Baker, Gilbert, Ariz.

[73] Assignee: Motorola, Inc., Schaumburg, Ill.

[21] Appl. No.: 829,657

[22] Filed: Feb. 3, 1992

[51] Int. Cl.⁵ .......................................... H01L 21/265
[52] U.S. Cl. ............................ 437/11; 148/DIG. 12; 148/DIG. 135; 437/974
[58] Field of Search ............ 148/DIG. 12, DIG. 135, 148/DIG. 60, DIG. 24; 437/11, 974

[56] References Cited

U.S. PATENT DOCUMENTS 4,589,928  5/1986  Dalton et al. ............... 148/DIG. 60

FOREIGN PATENT DOCUMENTS 216138  11/1984  Fed. Rep. of Germany .
56-105641  8/1981  Japan .
64-47044  2/1989  Japan .
234932  2/1990  Japan .

Primary Examiner—George Fourson
Attorney, Agent, or Firm—Joe E. Barbee

[57] ABSTRACT

A method is provided for making a plurality of intrinsic gettering sites in a bonded silicon substrate (21). A first silicon substrate (10) with a first and second surface (12, 13) is provided. The first surface (12) of the first silicon substrate (10) is implanted with a plurality of nucleation ions (14). The first silicon substrate (10) is then heated in such a manner that a plurality of nucleation sites form from the plurality of nucleation ions. A second substrate (20) with a first surface (22) is then bonded to the first surface(12) of the first silicon substrate (10). A predetermined portion (24) of the first silicon substrate (10) is removed from the second surface (13) of the first silicon substrate (10), thereby providing a thin substrate having a plurality of intrinsic gettering sites near its active area, wherein the thin substrate is bonded to a handle semiconductor substrate (21).

10 Claims, 1 Drawing Sheet

METHOD FOR MAKING INTRINSIC GETTERING SITES IN BONDED SUBSTRATES

BACKGROUND OF THE INVENTION

This invention relates, in general, to fabrication of semiconductor products, and more particularly, to fabrication of semiconductor devices on bonded wafers.

Conventionally, intrinsic gettering techniques or methods are used on a single silicon substrate to reduce or prevent process-induced defects and contamination defects that occur during normal processing. These intrinsic gettering techniques or methods are achieved by thermal treatments to the silicon substrate, thus providing a clean defect-free surface for subsequent fabrication of semiconductor devices, as well as locating defect sites or impurity sites in the interior bulk of the semiconductor substrate. Locating these impurity sites or defect sites in the inactive regions of the bulk semiconductor material improves performance levels of yet-to-be-built semiconductor devices on the clean, defect-free surface.

Generally, a bonded wafer is made of two semiconductor substrates that are joined together, thus forming a source or active substrate and a handling substrate.

However, in conventional processing of bonded semiconductor wafers, use of intrinsic gettering methods or techniques is not done, thus degrading yet-to-be-built semiconductor devices. Conventional intrinsic gettering methods are not done because intrinsic gettering methods create impurity sites in the middle of the bulk silicon substrate and since the bonded silicon substrate is polished back, the intrinsic gettering sites are removed by the polishing, thus removing the intrinsic gettering capability from the bonded semiconductor substrate or source wafer. By not providing intrinsic gettering in the source wafer or in an active wafer, semiconductor devices that are going to be built on the source or the active wafer will be negatively affected by process-induced defects and contamination, thereby degrading the performance of the semiconductor devices.

It can be readily seen that conventional intrinsic gettering methods and techniques are severely limited when working with bonded wafers. Also, it is clearly evident that by not providing intrinsic gettering in bonded wafers the performance of semiconductor devices that are built on the active or source wafer will be degraded. Therefore, a method for making an intrinsic gettering region in a source or an active wafer used in a bonded wafer would be highly desirable.

SUMMARY OF THE INVENTION

Briefly stated, a method is provided for making a plurality of intrinsic gettering sites in a bonded silicon substrate. A first silicon substrate with a first and second surface is provided. The first surface of the first silicon substrate is implanted with a plurality of nucleation ions. The first silicon substrate is then heated in such a manner that a plurality of nucleation sites form from the plurality of nucleation ions. A second substrate with a first surface is then bonded to the first surface of the first silicon substrate. A predetermined portion of the first silicon substrate is removed from the second surface of the first silicon substrate, thereby making a plurality of intrinsic gettering sites in the first silicon substrate of a bonded semiconductor substrate.

DETAILED DESCRIPTION OF THE DRAWINGS

Figure 1:
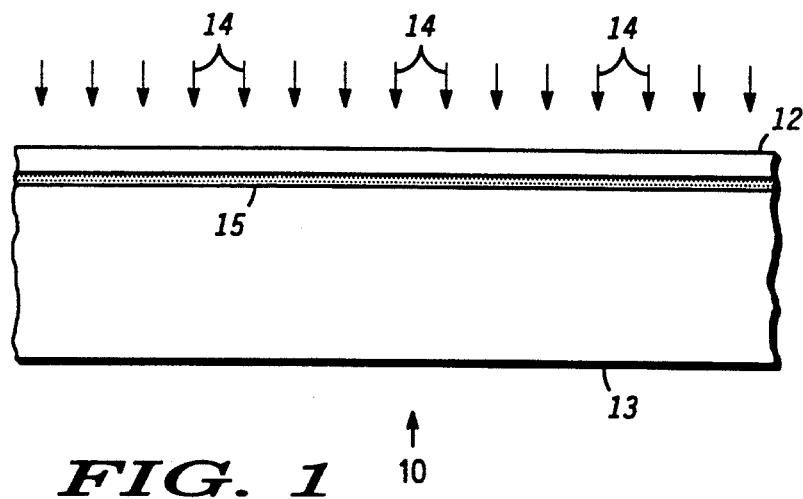
FIG. 1 is a simplified cross-sectional view of a portion of a silicon semiconductor substrate partially prepared in accordance with the present invention.

FIG. 1 is a simplified cross-sectional view of a portion of a silicon substrate 10 partially prepared in accordance with the present invention. In the present invention, a sequence of well-known steps is used to provide a silicon substrate or wafer 10 bonded to another substrate or wafer 20 to provide a bonded silicon substrate with intrinsic gettering capability.

Generally, silicon substrate 10 is made of a silicon wafer used for semiconductor manufacturing with a first surface 12 and a second surface 13. Typically, first surface 12 is a smooth polished surface, whereas second surface 13 is typically not polished. Additionally, it should be understood that first surface 12 is commonly prepared by several different processes, such as a variety of surface preparation procedures (e.g. acid treatments, base treatments, solvent treatments, et cetera), epitaxial depositions, or the like; however, it should be further understood that these additional processes are not necessary for the practice of the present invention.

Generally, first surface 12 is implanted with a multitude of ions, represented by arrows 14, thereby creating a region 15 which is ion rich in silicon substrate 10. Implantation of ions 14 into silicon substrate 10 is achieved by well-known methods in the art. Typically, ions from several different elements are capable of being implanted into semiconductor substrate 10, such as oxygen, boron, argon, and krypton. Typically, implant doses of the previously mentioned ions ranging from 1e15 atoms/cm$^3$ to 1e18 atoms/cm$^3$, with a depth ranging from 0.3 micron to 2 microns. In a preferred embodiment of the present invention, oxygen ions are implanted into silicon substrate 10, to produce dose density and depth that is adjusted to 1e17 atoms/cm$^3$ and 0.5 micron, respectively. It should be understood that processing parameters vary from system to system and that the depth and the number of ions implanted into silicon substrate 10 vary according to specific applications.

Once silicon substrate 10 has been implanted with ions 14 forming region 15 which is ion rich, silicon substrate 10 is thermally cycled or heat-treated in such a manner as to cause implanted ions in region 15 to form nuclei. It is believed that these nuclei slowly diffuse and coalesce to form small clusters of nuclei in region 15; however, thermal cycling of semiconductor wafer 10 must be carefully adjusted so that diffusion of the coalesced nuclei are not allowed to diffuse out from silicon substrate 10. Additionally, it should be understood that thermal cycling not only affects region 15 but also affects the bulk of silicon substrate 10 as well. As thermal cycling continues in silicon substrate 10, the clusters of nuclei in region 15 grow in size, thus forming gettering sites which trap mobile ions, such as iron, zinc, chromium, and the like that are induced by subsequent processing.

Typically, thermal cycling of silicon substrate or wafer 10 is achieved by either a single-step process or a multi-step process. By way of example, in a single-step process, silicon substrate 10 is heated in an inert gas environment, such as argon or nitrogen, with a temperature ranging from 700 degrees Celsius to 950 degrees Celsius for a time period ranging from 4 to 8 hours. In a preferred embodiment of the present invention, silicon substrate 10 is thermally cycled in an argon environment at a temperature that is substantially adjusted to 825 degrees Celsius for a period of 6 hours.

Typically, the multi-step process is broken into two steps. In the first step, silicon substrate 10 is heated in an inert environment, such as argon or nitrogen, with a temperature ranging from 700 degrees Celsius to 1050 degrees Celsius for a time period ranging from 4 to 8 hours. However, in a preferred embodiment of the present invention, silicon substrate 10 is thermally cycled in an argon environment with a temperature range from 700 degrees Celsius to 850 degrees Celsius for a period of time from 4 to 6 hours. During the first step of the multi-step process, it is believed that a large number of the implanted ions in region 15 nucleate to form small clusters. It is also believed that by using the first step in the multi-step process that a larger number of nucleation sites will occur in region 15, thus providing a larger number of sites for improved intrinsic gettering. In the second step of the multi-step process, silicon substrate or wafer 10 is thermally cycled in an inert environment, such as argon or nitrogen with the temperature ranging from 900 degrees Celsius to 1050 degrees Celsius for a time period ranging from 1 to 4 hours. In a preferred embodiment of the present invention silicon substrate 10 is thermally cycled in an argon environment at a temperature range adjusted from 950 degrees Celsius to 1000 degrees Celsius for a period on an order of 2 hours. During the second step of the multi-step process, the nucleation clusters grow in size from 30 to 50 angstroms to approximately 500 to 1000 angstroms in radius, thus creating a large number of nucleation sites or clusters that have sufficient size to capture and trap fast diffusing impurities, such as chromium, iron, nickel, zinc, and the like induced by conventional semiconductor processing.

Figure 2:
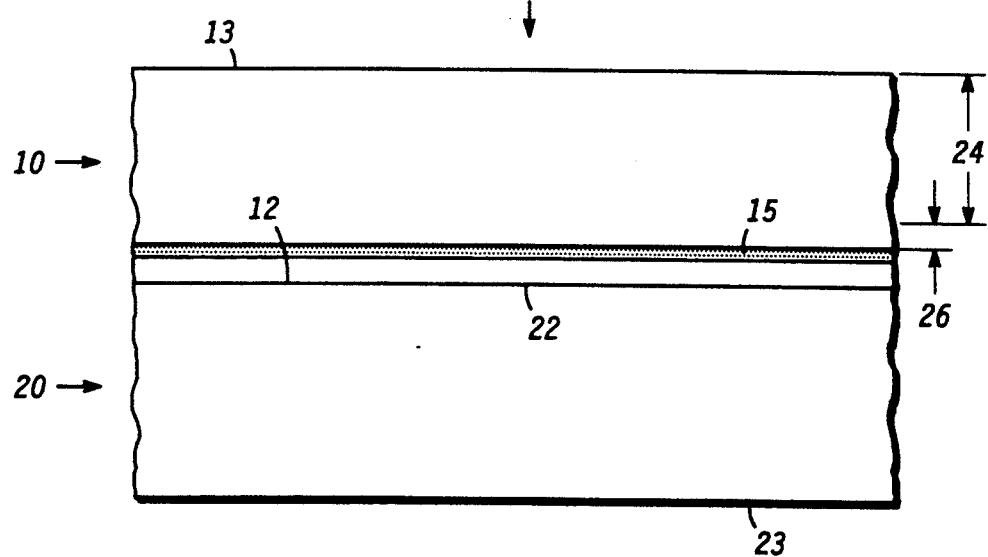
FIG. 2 is a simplified cross-sectional view of a silicon semiconductor substrate and a substrate bonded together in partial preparation of the present invention.

FIG. 2 is a simplified cross-sectional view of silicon substrate 10 bonded to a substrate 20. Silicon substrate 10 is prepared as previously described in FIG. 1. Generally, in a preferred embodiment of the present invention, substrate 20 is made of a silicon semiconductor substrate with a first surface 22 and a second surface 23; however, other substrates may also be used, such as silicon carbide, or glass. First surface 22 of substrate 20 typically is a polished, smooth surface, whereas second surface 23 of substrate 20 is not polished. Surface 22 of substrate 20 is prepared for bonding to silicon semiconductor substrate 10 by a number of possible processes, such as a variety of surface preparation procedures (e.g., acid, base, solvent treatments, et cetera), epitaxial depositions, oxide depositions, and thermally grown oxides. Additionally, the previously mentioned processes are sometimes used in combination to prepare substrate 20 for bonding to silicon wafer 10. For the sake of simplicity, only a brief description of well-known processes used for bonding silicon substrate 10 to substrate 20 will be discussed hereinafter.

Generally, surface 12 of silicon substrate 10 and surface 22 of substrate 20 are cleaned so as to provide particle-free surfaces. Surface 12 and surface 22 are then brought together in such a manner that surface 12 and surface 22 are mated, thus providing a void-free bond between silicon substrate 10 and substrate 20. It should be understood that a single line is used herein to illustrate mated surfaces 12 and 22. Typically, once silicon substrate 10 and substrate 20 have been mated, a thermal cycle is commonly done to further drive the bonding process of silicon substrate 10 and substrate 20 to completion. Generally, even though temperatures used in the bonding process are high enough to cause some movement of region 15, there is an insufficient amount of time for any significant amount of movement of region 15 to occur. With silicon substrate 10 firmly bonded to substrate 20, substrate 20 is capable of being used as a handle substrate or handle wafer for further processing of silicon substrate 10.

Additionally, the bonding process and the thermal cycling of first silicon substrate are capable of being combined. Typically, silicon substrate 10 and substrate are cleaned and mated as previously described. Thermal cycling of bonded silicon substrate 21 is done by either the single step process or the multi-step process, thus creating gettering sites in region 15 while simultaneously driving the bonding process of silicon substrate 10 and substrate 20 to completion.

Accordingly, in the present invention, region 15, which provides intrinsic gettering, is now located near mating surfaces 12 and 22, thus allowing for a predetermined portion 24 of silicon substrate 10 to be removed so that a clean, defect-free surface is positioned in close proximity to region 15 for intrinsic gettering.

Typically, removal of the predetermined portion 24 of silicon substrate 10 is achieved by well-known methods in the art, such as polishing or lapping. Briefly, this process involves removal of silicon from surface 13 of silicon substrate 10 by a chemical-mechanical process used for preparing single silicon wafers for manufacturing. 20 is used as a handle wafer to support and to facilitate the polishing or lapping process of silicon substrate 10. In a preferred embodiment of the present invention, removal of silicon from surface 13 is continued until a distance 26 of not less than 1.0 micron from region 15 is achieved. It should be understood that distance 26 is variable depending upon the specific semiconductor devices that are yet to be built. For example, if distance 26 is less than 1.0 micron, electrical activity of the yet to be built semiconductor devices may draw the gettered impurities that are sequestered in region 15 in the semiconductor device.

Figure 3:
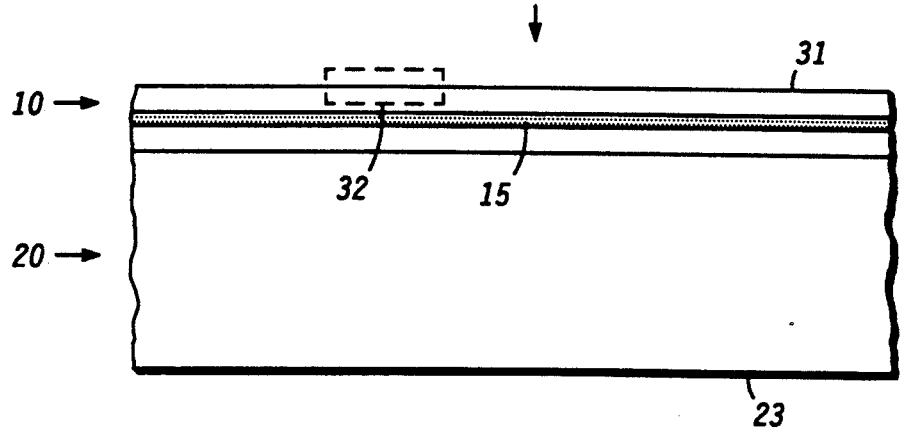
FIG. 3 is a simplified cross-sectional view of a bonded silicon semiconductor substrate prepared in accordance with the present invention.

FIG. 3 is a simplified cross-sectional view of bonded semiconductor substrate 21 after removal of predetermined portion 24. Typically, removal of a portion of semiconductor substrate 10 is accomplished by polishing back semiconductor substrate 10, as shown in FIG. 2, thereby producing simplified cross-sectional view in FIG. 3.

Once predetermined portion 24 of semiconductor substrate 10 has been removed from bonded wafer 21, bonded wafer 21 is ready for further fabrication of semiconductor devices, which will be located on surface 31. Dotted lined box 32 represents one of a plurality of semiconductor devices which are fabricated on surface 31. By using the present invention, intrinsic gettering region or layer 15 is ideally located to provide intrinsic gettering capability for surface 31, on which semiconductor devices are yet to be built. In other words, gettering region 15 is now near the active area of thinned wafer or substrate 10.

By now it should be appreciated that a novel combination of steps has been described for making an intrinsic gettering region for a bonded silicon semiconductor substrate. Additionally, the method allows for gettering of process-induced defects and for removal of mobile ion contamination, unavoidable introduced during semiconductor device fabrication.

I claim:

1. A method for making a plurality of intrinsic gettering sites in a bonded silicon substrate comprising:
   providing a first silicon substrate with a first and second surface;
   implanting a plurality of nucleation ions into the first surface of the first silicon substrate;
   heating the first silicon substrate in such a manner that a plurality of nucleation sites form from the plurality of nucleation ions;
   bonding a second substrate to the first surface of the first silicon substrate; and
   removing a portion of the first silicon substrate from the second surface, thereby providing the first silicon substrate with the plurality of intrinsic gettering sites near an active area of the first silicon substrate.

2. The method of claim 1 wherein the implanting of nucleation ions into the first surface of the first silicon substrate is achieved with a depth ranging from 0.3 micron to 2.0 microns.

3. The method of claim 1 wherein the heating of the first silicon substrate is achieved by a single-step process that thermally cycles the first silicon substrate once.

4. The method of claim 3 wherein the single-step process is achieved by heating at a temperature and time period from 700 degrees Celsius to 950 degrees Celsius and from 4 to 8 hours, respectively.

5. The method of claim 1 wherein the heating of the first silicon substrate is achieved by a multi-step process that thermally cycles the first silicon substrate more than once.

6. The method of claim 5 wherein the multi-step process is achieved by first heating the first silicon substrate to a temperature range from 700 degrees Celsius to 1050 degrees Celsius for a period of time ranging from 4 to 8 hours and second heating the first silicon substrate to a temperature range from 900 degrees Celsius to 1050 degrees Celsius for a time period ranging from 1 to 4 hours.

7. A method for trapping mobile ions in a silicon semiconductor substrate during fabrication of a plurality of semiconductor devices on bonded silicon semiconductor substrates, comprising:
   providing a first silicon substrate with a first and second surface;
   implanting a plurality of nucleation ions into the first surface of the first silicon substrate;
   bonding the first silicon substrate on the first surface to a second silicon substrate, wherein the bonding of the first silicon substrate and the second silicon substrate further creates a plurality of nucleation sites for trapping mobile ions in the first silicon substrate;
   removing an amount of the first silicon substrate from the second surface, thereby creating a third surface of the first silicon substrate on which to fabricate the plurality of semiconductor devices; and
   fabricating the plurality of semiconductor devices on the third surface of the first silicon substrate.

8. The method of claim 7 wherein the implanting of the nucleation ions comprises implanting the nucleation ions to a depth of 0.3 micron to 2.0 micron.

9. The method of claim 8 wherein the depth is substantially 0.5 micron.

10. The method of claim 7 wherein the nucleation ions comprise oxygen, argon, phosphorous, arsenic or mixtures thereof.

* * * * *